United States Patent
Yin et al.

(10) Patent No.: US 7,989,899 B2
(45) Date of Patent: Aug. 2, 2011

(54) TRANSISTOR, INVERTER INCLUDING THE SAME AND METHODS OF MANUFACTURING TRANSISTOR AND INVERTER

(75) Inventors: Huaxiang Yin, Yongin-si (KR); Ihun Song, Seongnam-si (KR); Sunil Kim, Yongin-si (KR); Youngsoo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/453,106

(22) Filed: Apr. 29, 2009

(65) Prior Publication Data

US 2010/0059744 A1    Mar. 11, 2010

(30) Foreign Application Priority Data

Sep. 10, 2008 (KR) .................. 10-2008-0089337

(51) Int. Cl.
*H01L 29/02* (2006.01)
*H01L 29/10* (2006.01)

(52) U.S. Cl. ..... 257/402; 257/60; 257/69; 257/E27.011; 257/E27.029; 257/E27.061

(58) Field of Classification Search .......... 257/43, 257/60, 69, 402
See application file for complete search history.

(56) References Cited

U.S. PATENT DOCUMENTS

| | | | | |
|---|---|---|---|---|
| 3,700,981 | A * | 10/1972 | Masuhara et al. | 326/112 |
| 2001/0015437 | A1* | 8/2001 | Ishii et al. | 257/12 |
| 2001/0055838 | A1* | 12/2001 | Walker et al. | 438/129 |
| 2002/0017644 | A1* | 2/2002 | Fitzgerald | 257/69 |
| 2002/0048190 | A1* | 4/2002 | King | 365/185.18 |
| 2003/0067030 | A1* | 4/2003 | Torii | 257/315 |
| 2003/0230776 | A1* | 12/2003 | Liu et al. | 257/319 |
| 2004/0130934 | A1* | 7/2004 | Prall et al. | 365/154 |
| 2004/0183119 | A1* | 9/2004 | Negoro et al. | 257/314 |
| 2005/0224590 | A1* | 10/2005 | Melngailis et al. | 235/492 |
| 2008/0073653 | A1* | 3/2008 | Iwasaki | 257/79 |
| 2008/0290394 | A1* | 11/2008 | Duan et al. | 257/316 |
| 2010/0085081 | A1* | 4/2010 | Ofuji et al. | 326/102 |

* cited by examiner

*Primary Examiner* — Michael S Lebentritt
*Assistant Examiner* — Karen M Kusumakar
(74) *Attorney, Agent, or Firm* — Harness, Dickey & Pierce, P.L.C.

(57) ABSTRACT

A transistor, an inverter including the transistor, and methods of manufacturing the inverter and the transistor. A gate insulating layer of the transistor has a charge trap region. A threshold voltage may be moved in a positive (+) direction by trapping charges in the charge trap region. The transistor may be an enhancement mode oxide thin-film transistor (TFT) and may be used as an element of the inverter.

11 Claims, 16 Drawing Sheets

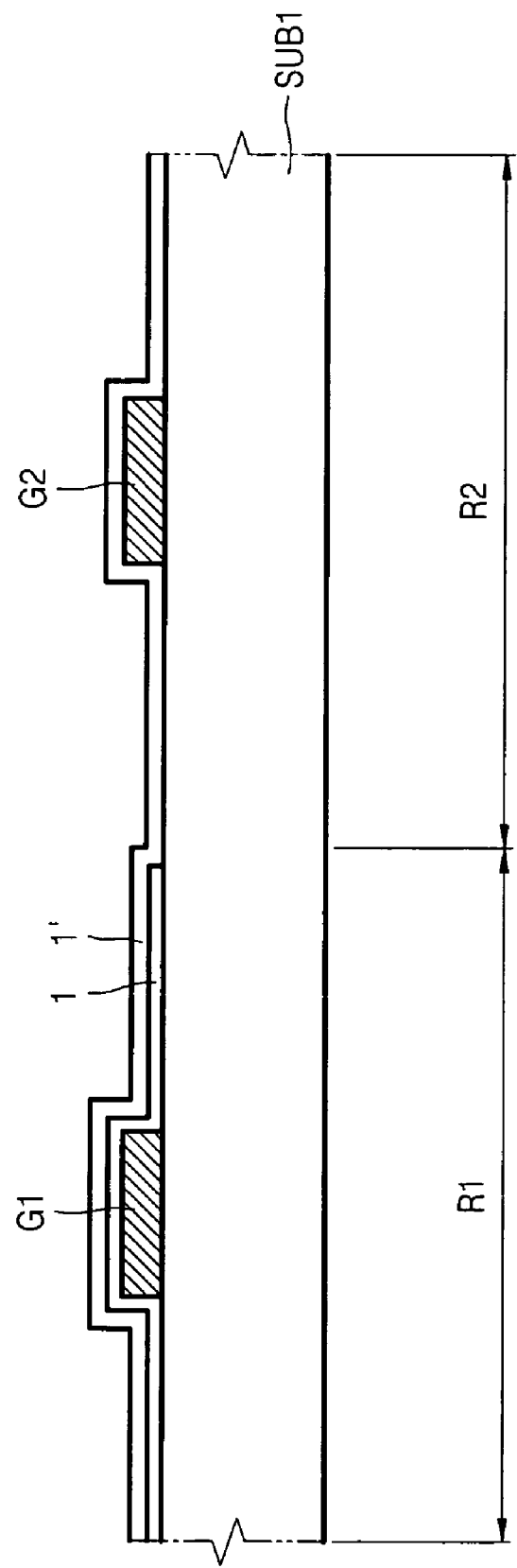

TRANSISTOR, INVERTER INCLUDING THE SAME AND METHODS OF MANUFACTURING TRANSISTOR AND INVERTER

PRIORITY STATEMENT

This non-provisional patent application claims priority under 35 U.S.C. §119 to Korean Patent Application No. 10-2008-0089337, filed on Sep. 10, 2008, in the Korean Intellectual Property Office (KIPO), the entire contents of which is incorporated herein by reference.

BACKGROUND

1. Field

Example embodiments relate to a transistor and an inverter, and methods of manufacturing a transistor and an inverter.

2. Description of the Related Art

In semiconductor integrated circuits, e.g., dynamic random access memories (DRAM), static random access memories (SRAM), non-volatile memories, liquid crystal display devices, and organic light emitting devices, various logic circuits, e.g., NAND (not and) and NOR (not or) circuits, may be used. An inverter is the base of the logic circuits.

In general, a Si-based inverter is a complementary metal-oxide semiconductor (CMOS) including both an n-channel metal-oxide semiconductor (NMOS) transistor and a p-channel metal-oxide semiconductor (PMOS) transistor. When a Si layer is used as a channel layer, the NMOS or PMOS transistor may be easily formed by varying the type of doping elements for the channel layer, and thus, a CMOS inverter may be easily manufactured.

However, when a channel layer is formed using an oxide semiconductor, forming a p-channel layer due to the characteristics of the material in the oxide semiconductor may be difficult. In other words, a channel layer formed of an oxide semiconductor is usually an n-channel layer. Also, a transistor that may include an oxide semiconductor layer as a channel layer, for example, an oxide transistor, is usually a depletion-mode transistor having a threshold voltage of less than 0 V, and manufacturing an oxide transistor as an enhancement-mode transistor may be difficult. Accordingly, when an oxide semiconductor is applied to form a channel layer, manufacturing an inverter with desirable characteristics may be difficult.

SUMMARY

Example embodiments include a transistor, an inverter including the transistor, and methods of manufacturing the same. Additional example embodiments will be set forth in the description that follows and, will be apparent from the description, or may be learned by practice of example embodiments.

According to example embodiments, a transistor including a gate electrode and a channel layer separated from each other; a gate insulating layer between the gate electrode and the channel layer including a charge trap region; and a source electrode and a drain electrode in contact with respective ends of the channel layer, the threshold voltage of the transistor may increase as charges are trapped in the charge trap region.

The transistor may be an enhancement-mode transistor. The transistor may be an oxide thin-film transistor (TFT). The channel layer of the transistor may include a ZnO-based oxide. The channel layer of the transistor may be a non-oxide layer. The gate insulating layer may include a silicon nitride layer. The gate insulating layer may include a first silicon oxide layer between the silicon nitride layer and the gate electrode.

The gate insulating layer may include a second silicon oxide layer between the silicon nitride layer and the channel layer. The gate insulating layer may have one of a high-k dielectric layer/silicon nitride layer structure, a first high-k dielectric layer/second high-k dielectric layer/third high-k dielectric layer structure, an inverse high-k dielectric layer/silicon nitride layer structure, an inverse first high-k dielectric layer/second high-k dielectric layer/third high-k dielectric layer structure, and a structure in which a plurality of nanostructures are embedded in an insulating layer.

According to example embodiments, an inverter including a load transistor and the transistor of example embodiments, wherein the transistor is a switching transistor connected to the load transistor.

A gate insulating layer of the load transistor and the gate insulating layer of the switching transistor may have different structures. The load transistor may be a depletion-mode transistor, and the switching transistor may be an enhancement-mode transistor. The load transistor and the switching transistor may be oxide thin-film transistors (TFTs). The channel layers of the load transistor and the switching transistor may include a ZnO-based oxide. The channel layers of the load transistor and the switching transistor may be a non-oxide layer.

The gate insulating layer of the switching transistor may include a silicon nitride layer. The gate insulating layer of the load transistor may include a silicon oxide layer. The gate insulating layer of the load transistor may include a silicon oxide layer and a silicon nitride layer sequentially stacked in order on a gate electrode of the load transistor which corresponds to the gate insulating layer of the load transistor.

The gate insulating layer of the switching transistor may include a silicon oxide layer and a silicon nitride layer sequentially stacked in order on a gate electrode of the switching transistor which corresponds to the gate insulating layer of the switching transistor, and the silicon oxide layer of the gate insulating layer of the switching transistor may have a thickness equal to or less than the thickness of the silicon oxide layer of the gate insulating layer of the load transistor.

The gate insulating layer of the load transistor may include a first silicon oxide layer, a silicon nitride layer, and a second silicon oxide layer sequentially stacked in order on a gate electrode of the switching transistor which corresponds to the gate insulating layer of the load transistor, and a gate insulating layer of the switching transistor includes a first silicon oxide layer, a silicon nitride layer, and a second silicon oxide layer sequentially stacked in order on a gate electrode which corresponds to the gate insulating layer of the switching transistor, and the first silicon oxide layer of the gate insulating layer of the switching transistor may have a thickness equal to or less than the thickness of the first silicon oxide layer of the gate insulating layer of the load transistor.

The gate insulating layer of the load transistor and the gate insulating layer of the switching transistor may have one of a high-k dielectric layer/silicon nitride layer structure, a first high-k dielectric layer/second high-k dielectric layer/third high-k dielectric layer structure, an inverse high-k dielectric layer/silicon nitride layer structure, and an inverse first high-k dielectric layer/second high-k dielectric layer/third high-k dielectric layer structure, and at least one layer of the gate insulating layer of the switching transistor may have a different thickness from the thickness of at least one of the layers of the gate insulating layer of the load transistor.

The gate insulating layer of the switching transistor may have a structure in which a plurality of nano-structures may be embedded in an insulating layer. At least one of the load transistor and the switching transistor may be a bottom gate thin film transistor or a top gate thin film transistor.

According to example embodiments, there is provided a method of manufacturing a semiconductor device including providing a first transistor including a gate electrode, a gate insulating layer, a channel layer, and a source and a drain, wherein a charge trap region may be formed in the gate insulating layer; and increasing a threshold voltage of the first transistor by trapping charges in the charge trap region.

As the threshold voltage of the first transistor is increased, the first transistor may be changed from a depletion mode to an enhancement mode. When forming the first transistor, a second transistor connected to the first transistor may be formed. In example embodiments, the first and second transistors may correspond to the switching transistor and the load transistor, and the semiconductor device may be an inverter.

Increasing the threshold voltage of the first transistor may include applying a voltage to the gate electrode of the first transistor, and the voltage may be greater than a voltage used during a normal operation of the inverter.

When applying a voltage to the gate electrode of the first transistor, a voltage may be applied to a drain of the second transistor. The voltage applied to the gate electrode of the first transistor and the voltage applied to the drain of the second transistor may be approximately the same. The load transistor and the switching transistor may be oxide thin film transistors.

The channel layers of the load transistor and the switching transistor may include a ZnO-based oxide. The channel layers of the load transistor and the switching transistor may be a non-oxide layer. The non-oxide layer may be formed using a low temperature process.

According to example embodiments, there is provided a logic circuit including the inverter of example embodiments. The above-described inverters according to example embodiments may include at least one of a NAND circuit, a NOR circuit, an encoder, a decoder, a multiplexer (MUX), a demultiplexer (DEMUX), and a sense amplifier. According to example embodiments, there is provided a semiconductor device including the inverter of example embodiments. The semiconductor device may be a 1D(diode)-1R(resistor) multi-layer cross-point memory device.

BRIEF DESCRIPTION OF THE DRAWINGS

Example embodiments will be more clearly understood from the following brief description taken in conjunction with the accompanying drawings. FIGS. 1-11 represent non-limiting, example embodiments as described herein.

FIGS. 1 through 4 are each cross-sectional views of an inverter, according to example embodiments;

FIG. 5 is a circuit diagram of the inverters of FIGS. 1 through 4, according to example embodiments;

FIGS. 6A through 6F are cross-sectional views illustrating a method of manufacturing an inverter, according to example embodiments;

FIG. 7 is a circuit diagram illustrating a part of the method of manufacturing an inverter, according to example embodiments;

FIGS. 8 and 9 are graphs showing variation of the characteristics of a transistor according to an application of a high voltage during the manufacturing method of an inverter, according to example embodiments;

FIG. 10 is a graph showing variation in the characteristics of a transistor according to an application of a high voltage, according to a comparative example; and FIG. 11 is a waveform diagram of an input voltage and an output voltage of an inverter according to example embodiments.

Figure 1:
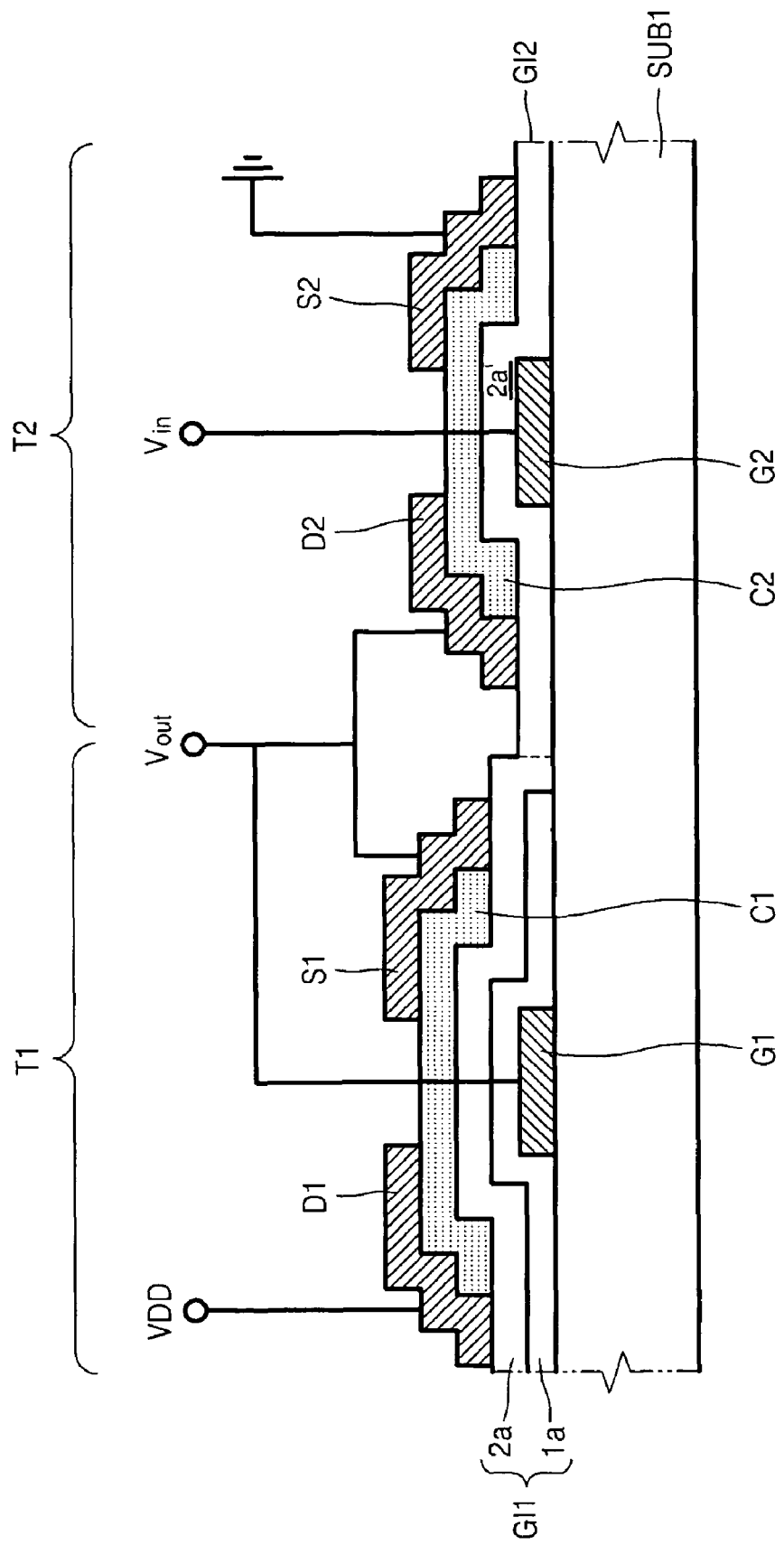

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. According to example embodiments, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. According to example embodiments, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

According to example embodiments, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Detailed illustrative example embodiments are disclosed herein. However, specific structural and functional details disclosed herein are merely representative for purposes of describing example embodiments. There may be embodiments in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives. Like numbers refer to like elements throughout the description of the figures.

It will be understood that when an element or layer is referred to as being "formed on," another element or layer, it may be directly or indirectly formed on the other element or layer. According to example embodiments, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Example embodiments relate to a transistor, an inverter including the transistor, a logic circuit including the inverter, and methods of manufacturing the same. In the drawings, the thicknesses of layers and regions are exaggerated for clarity. Like reference numerals in the drawings denote like elements.

FIG. 1 is a cross-sectional view of an inverter according to example embodiments. Referring to FIG. 1, a load transistor T1 and a switching transistor T2 may be formed on a substrate SUB1, and may be electrically connected to each other. The switching transistor T2 may be referred to as a driving transistor. The load transistor T1 may be a depletion-mode transistor, and the switching transistor T2 may be an enhancement-mode transistor. When a gate voltage is 0 V, the depletion-mode transistor may be turned 'on', meaning that a substantially measurable current may be flowing. On the other hand, an enhancement-mode transistor may be turned 'off' when a gate voltage is about 0 V. Accordingly, a threshold voltage of the depletion-mode transistor may be smaller than about 0 V, and a threshold voltage of the enhancement-mode transistor may be greater than about 0 V.

The load transistor T1 and the switching transistor T2 may be thin-film transistors (TFTs), for example, oxide TFTs. However, they need not be TFTs. If the load transistor T1 and the switching transistor T2 are TFTs, they may have a bottom gate structure as illustrated in FIG. 1. For example, a first gate electrode G1 and a second gate electrode G2 may be formed separately on the substrate SUB1, and a first channel layer C1 and a second channel layer C2 may be formed over the first and second gate electrodes G1 and G2. The first and second channel layers C1 and C2 may include oxide semiconductors, e.g., ZnO-based oxide semiconductors including ZnO, InZnO, GaInZnO, and ZnSnO, and may further include other elements, e.g., one or more of Hf, Cr, Ta, Y, Ti, and Zr.

However, the material for the first and second channel layers C1 and C2 may not be limited to oxides. In other words, the first and second channel layers C1 and C2 may be non-oxide layers, and the non-oxide layers may be material layers that are be formed using a lower temperature process. An example of the non-oxide layer may be an amorphous silicon layer. A first gate insulating layer GI1 may be formed between the first gate electrode G1 and the first channel layer C1 and a second gate insulating layer GI2 may be formed between the second gate electrode G2 and the second channel layer C2. The first gate insulating layer GI1 may include, for example, a silicon oxide layer 1a on the substrate SUB1 and the first gate electrode G1, and furthermore, a silicon nitride layer 2a between the silicon oxide layer 1a and the first channel layer C1. The silicon nitride layer 2a may be included for ease of manufacturing.

The second gate insulating layer GI2 may include a silicon nitride layer 2a'. The structure of the first and second gate insulating layers GI1 and GI2 may be modified, and will be further described in detail later. A first source electrode S1 and a first drain electrode D1 that contact both ends of the first channel layer C1 may be formed on the first gate insulating layer GI1, and similarly, a second source electrode S2 and a second drain electrode D2 that contact both ends of the second channel layer C2 may be formed on the second gate insulating layer GI2. The first source electrode S1 and the second drain electrode D2 may be formed separate from each other, or as one single unit. The first gate electrode G1, the first gate insulating layer GI1, the first channel layer C1, the first source electrode S1, and the first drain electrode D1 may form the load transistor T1, and the second gate electrode G2, the second gate insulating layer GI2, the second channel layer C2, the second source electrode S2, and the second drain electrode D2 may form the switching transistor T2.

Although not illustrated in FIG. 1, a passivation layer covering the first channel layer C1, the first source electrode S1, the first drain electrode D1, the second channel layer C2, the second source electrode S2, and the second drain electrode D2 may be further formed on the first and second gate insulating layers GI1 and GI2.

A power source VDD may be connected to the first drain electrode D1, and an input terminal Vin may be connected to the second gate electrode G2. The first source electrode S1, the second drain electrode D2, and the first gate electrode G1 may be commonly connected to an output terminal Vout, and the second source electrode S2 may be grounded. According to another example embodiment, the first gate electrode G1 may be grounded instead of being connected to the output terminal Vout.

Hereinafter, the first and second gate insulating layers GI1 and GI2 will be described in detail. The first gate insulating layer GI1 may trap charges minimally or not at all. The load transistor T1 having the first gate insulating layer GI1 may be a depletion-mode transistor. The second gate insulating layer GI2 may include a charge trap region in which charges are trapped. According to example embodiments, the silicon nitride layer 2a' of the second gate insulating layer GI2 may be a layer that traps a relatively large amount of charges. As the second gate insulating layer GI2 traps charges, a threshold voltage of the switching transistor T2 may be moved in a positive (+) direction.

Accordingly, the switching transistor T2 may be an enhancement-mode transistor. In general, when an oxide semiconductor is used in a channel layer, realizing an enhancement-mode transistor may not be easy. However, according to example embodiments, an enhancement mode transistor may be realized by including a charge trap region in a gate insulating layer and trapping charges in the charge trap region, thereby increasing the threshold voltage to be greater than about 0V. The charge trapping method will be described in detail later. Concepts of example embodiments may be applied not only to oxide transistors but also to non-oxide transistors and transistors other than TFTs.

Example embodiments of inverters described above may be E/D inverters having a depletion mode transistor as the load transistor T1 and an enhancement mode transistor as the switching transistor T2. The E/D inverter may have improved characteristics compared to an inverter having a depletion mode transistor as the load transistor and a depletion mode transistor as the switching transistor.

Figure 2:
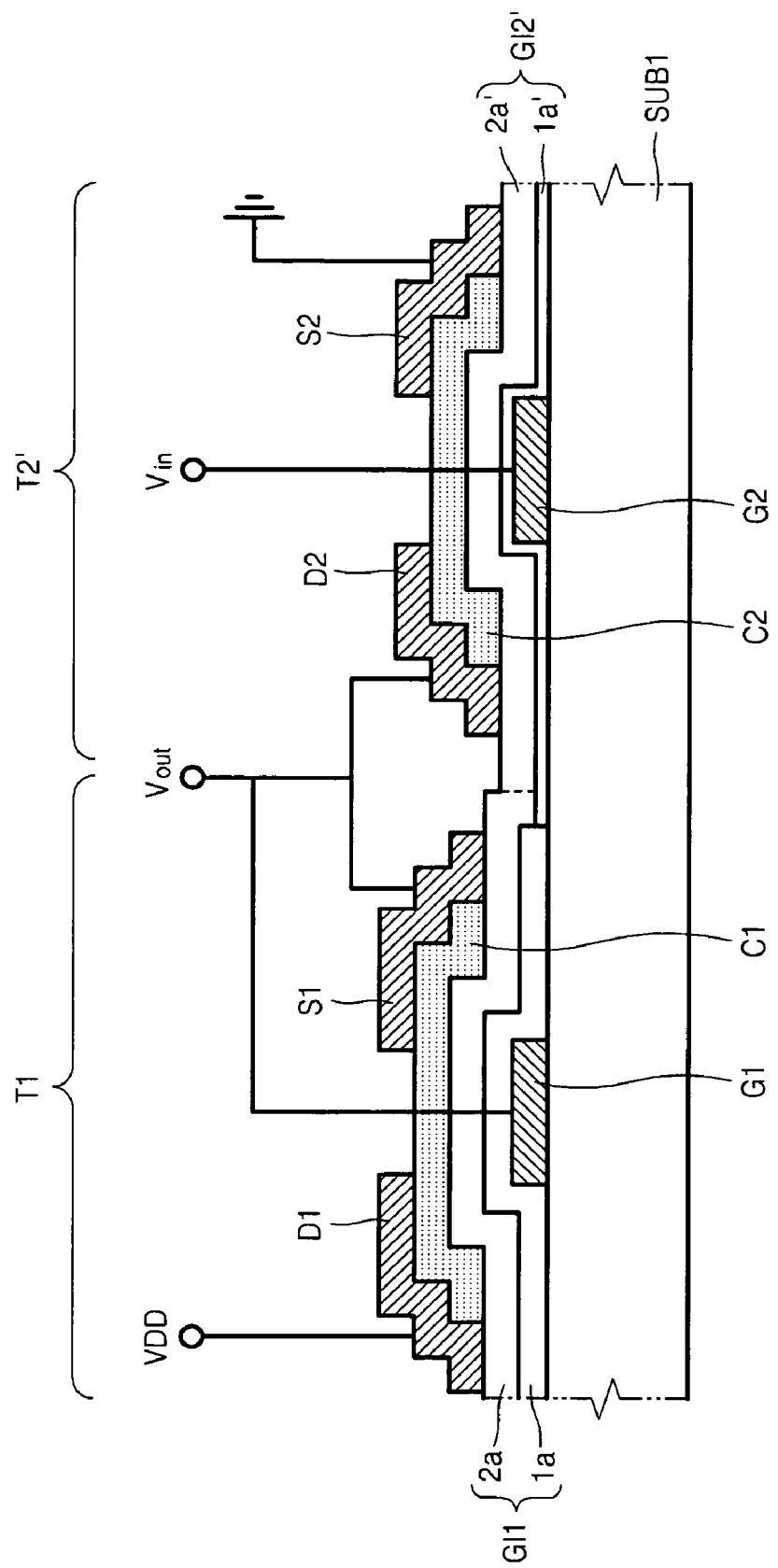

FIG. 2 is a cross-sectional view illustrating an inverter according to another example embodiment. The inverter of FIG. 2 is a modified example of the inverter of FIG. 1. The inverter of FIG. 2 may be identical to that of FIG. 1, except for the structure of a second gate insulating layer GI2'.

Referring to FIG. 2, the second gate insulating layer GI2' of the switching transistor T2' may include a silicon oxide layer 1a' on the substrate SUB1 and the second gate electrode G2 and a silicon nitride layer 2a' on silicon oxide layer 1a'. Hence, the silicon oxide layer 1a' may be interposed between the silicon nitride layer 2a' and the second gate electrode G2, and may prevent or reduce charges trapped in the silicon nitride layer 2a' from leaking out of the silicon nitride layer 2a'. The silicon oxide layer 1a' of the second gate insulating layer GI2' may be thinner than the silicon oxide layer 1a of the first gate insulating layer GI1.

According to example embodiments, the thickness of the silicon oxide layer 1a' of the second gate insulating layer GI2' may be about 100 Å or less, and the thickness of the silicon oxide layer 1a of the first gate insulating layer GI1 may be about 100 Å or more. The silicon oxide layer 1a' of the second gate insulating layer GI2' may be formed to have a relatively small thickness. If the silicon oxide layer 1a' is thicker, trapping charges in the silicon nitride layer 2a' may be difficult. However, the silicon oxide layer 1a of the first gate insulating layer GI1 may not necessarily be thicker than the silicon oxide layer 1a' of the second gate insulating layer GI2'. According to example embodiments, the thicknesses of the silicon oxide layers 1a' and 1a may be the same, and the silicon oxide layer 1a' of the second gate insulating layer GI2' may be thicker than the silicon oxide layer 1a of the first gate insulating layer GI1.

Example embodiments of FIG. 2 are a modification of example embodiments described with respect to FIG. 1. Although not illustrated in FIG. 2, other various modified embodiments of the inverter of FIG. 1 may be realized because the first gate insulating layer GI1 and the second gate insulating layer GI2 of FIG. 1 may be modified. As long as the first gate insulating layer GI1 traps charge minimally or not at all, and the second gate insulating layer GI2 traps larger amounts of charge, the material and structure of the first and second gate insulating layers GI1 and GI2 and the thicknesses of layers of the first and second gate insulating layers GI1 and GI2 may vary. The first gate insulating layer GI1 and the second gate insulating layer GI2 may have either a single-layer structure or a multi-layer structure, and either the same or a different structure, and the thicknesses of their layers may be identical or different, as well.

According to example embodiments, the first gate insulating layer GI1 may have a single-layer structure formed of silicon oxide, and according to circumstances, a single-layer structure that may be formed of other materials other than silicon oxide. Also, the first gate insulating layer GI1 may have a multi-layer structure in which a first silicon oxide layer, a silicon nitride layer, and a second silicon oxide layer are sequentially stacked.

Similarly, the second gate insulating layer GI2 also may have a multi-layer structure in which a first silicon oxide layer, a silicon nitride layer, and a second silicon oxide layer are sequentially stacked. When the first and second gate insulating layers GI1 and GI2 each have a multi-layer structure in which a first silicon oxide layer, a silicon nitride layer, and a second silicon oxide layer are sequentially stacked, the thickness of the first silicon oxide layer of the second gate insulating layer GI2 may be the same as or smaller than that of the first silicon oxide layer of the first gate insulating layer GI1. Also, the second silicon oxide layer of the second gate insulating layer GI2 may have the same thickness as or a different thickness from that of the second silicon oxide layer of the first gate insulating layer GI1.

In addition, at least the second gate insulating layer GI2 of the first and second gate insulating layers GI1 and GI2 may include one or more high-k dielectric layers. According to example embodiments, the first and second gate insulating layers GI1 and GI2 may each have one of a high-k dielectric layer/silicon nitride layer structure, a first high-k dielectric layer/second high-k dielectric layer/third high-k dielectric layer structure, and inversed structures of these. One or more of the layers of the second gate insulating layer GI2 may have a different thickness from the thickness of its corresponding one or more of layers of the first gate insulating layer GI1. Also, at least the second gate insulating layer GI2 of the first and second gate insulating layers GI1 and GI2 may have a structure in which a plurality of nano-structures, e.g., nano-particles, are embedded in the gate insulating layer. The first and second gate insulating layers GI1 and GI2 may have other variously modified structures than as described above.

Figure 3:
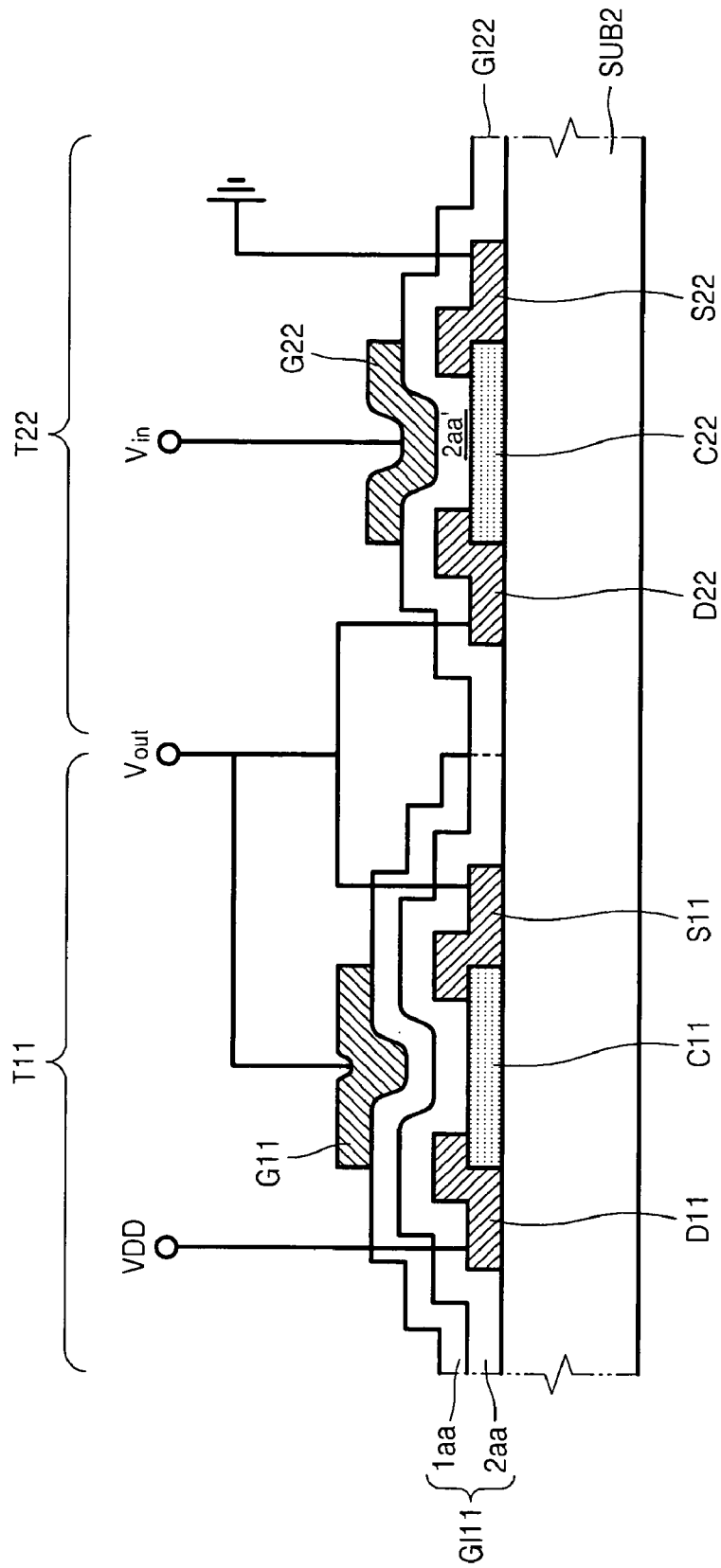
Figure 4:
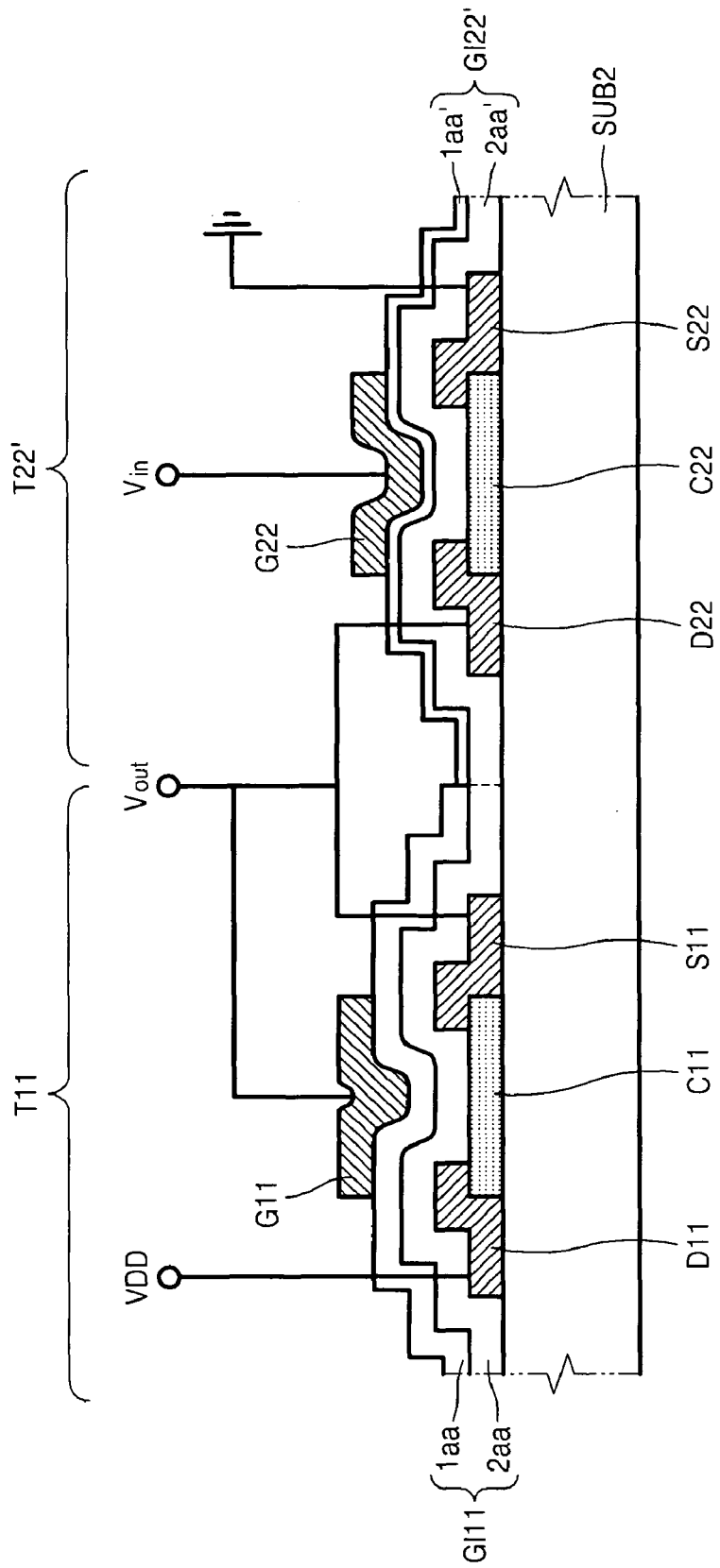

In FIGS. 1 and 2, the load transistor T1 and the switching transistors T2 and T2' may have a bottom gate structure. However, according to example embodiments, the load transistor T1 and the switching transistors T2 and T2' may have a top gate structure. FIGS. 3 and 4 illustrate inverters in which load transistors T11 and switching transistors T22 and T22' have a top gate structure.

Referring to FIG. 3, first and second channel layers C11 and C22 may be separately formed on a substrate SUB2. A first source electrode S11 and a first drain electrode D1 that contact both ends of the first channel layer C1 may be formed on the substrate SUB2, and a second source electrode S22 and a second drain electrode D22 that contact both ends of the second channel layer C22 may be formed on the substrate SUB2. First and second gate electrodes G11 and G22 may be formed over the first and second channel layers C11 and C22. A first gate insulating layer GI11 may be formed between the first channel layer C11 and the first gate electrode G11, and a second gate insulating layer GI22 may be formed between the second channel layer C22 and the second gate electrode G22.

For example, the first gate insulating layer GI11 may include a silicon oxide layer 1aa, and furthermore, a silicon nitride layer 2aa between the silicon oxide layer 1aa and the first channel layer C11. The structure of the first gate insulating layer GI11 may be an inverse structure to that of the first gate insulating layer GI1 of FIG. 1. For example, the second gate insulating layer GI22 may include a silicon nitride layer 2aa'. The first gate insulating layer GI11 may be a layer that traps charges minimally or not at all, and the second gate insulating layer GI22 may be a layer that traps larger amounts of charge.

The first gate electrode G11, the first gate insulating layer GI11, the first channel layer C11, the first source electrode S11, and the first drain electrode D11 may form the load transistor T11, and the second gate electrode G22, the second gate insulating layer GI22, the second channel layer C22, the second source electrode S22, and the second drain electrode D22 may form the switching transistor T22. The load transistor T11 may be a depletion-mode transistor, and the switching transistor T22 may be an enhancement-mode transistor.

The connection between the load transistor T11 and the switching transistor T22 and a power source VDD, an input terminal Vin, an output terminal Vout, and a grounding terminal may be as seen in FIG. 1. In FIG. 3, the first and second gate insulating layers GI11 and GI22 may be modified in the same manner as the first and second gate insulating layers GI1 and GI2 of FIG. 1.

FIG. 4 illustrates an example modified from FIG. 3 in which a second gate insulating layer GI22' may be different from the second gate insulating layer GI22 of FIG. 3. FIG. 4 shows that the second gate insulating layer GI22' of the switching transistor T22' may include a silicon oxide layer 1aa' and a silicon nitride layer 2aa'. The silicon oxide layer 1aa' may be interposed between the silicon nitride layer 2aa' and the second gate G22. According to example embodiments, the second gate insulating layer GI22' may have an inverse structure similar to that of the second gate insulating layer GI2' of FIG. 2.

Figure 5:
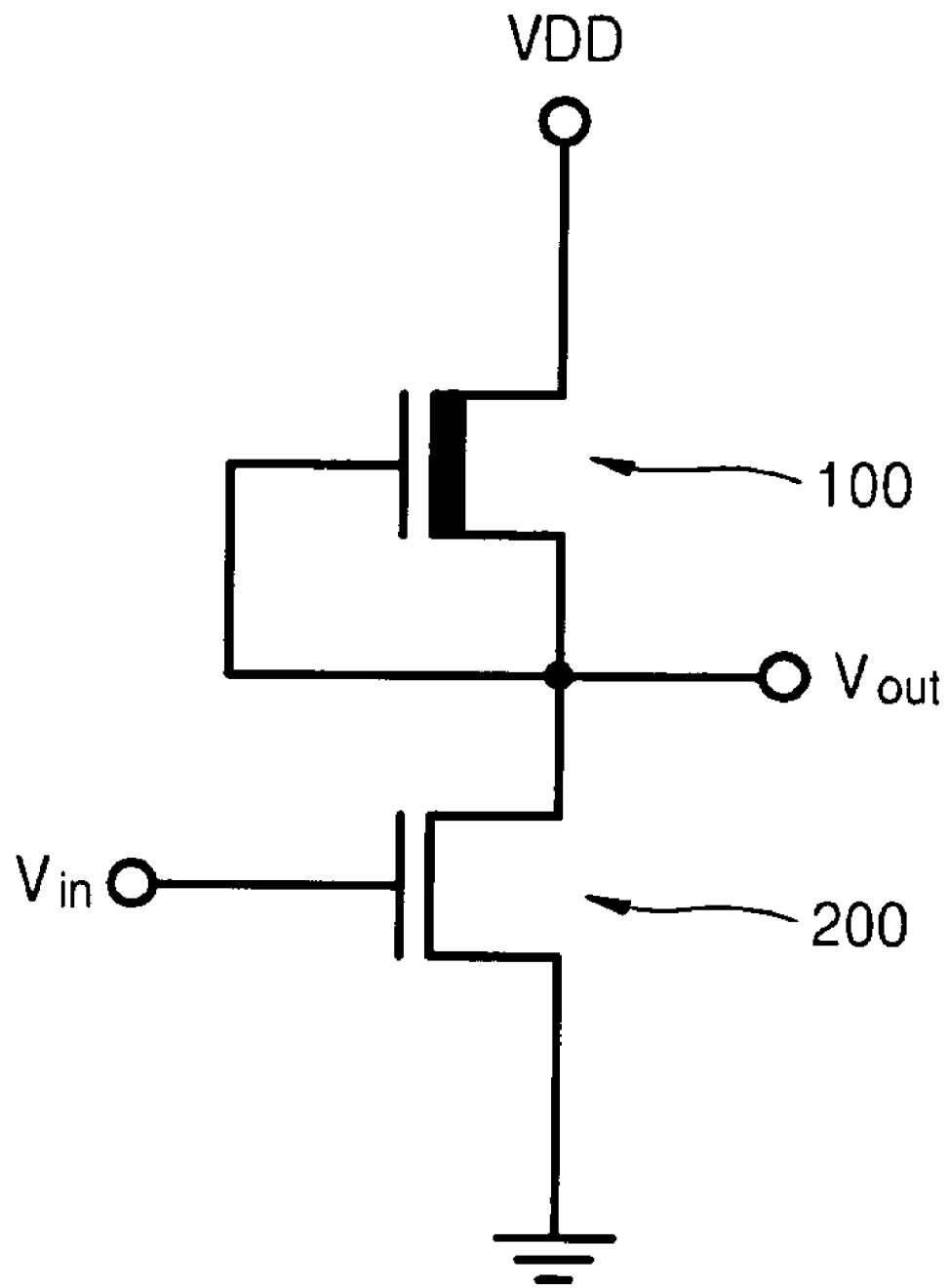

FIG. 5 is a circuit diagram of the inverters of FIGS. 1 through 4, according to example embodiments. FIG. 5 shows that a load transistor 100 as a depletion mode transistor and a switching transistor 200 as an enhancement mode transistor may be connected to each other. A power source VDD may be connected to a drain electrode of the load transistor 100, an input terminal Vin may be connected to a gate electrode of the switching transistor 200, and an output terminal Vout may be commonly connected to a source electrode of the load transistor 100 and a drain electrode of the switching transistor 200. A gate electrode of the load transistor 100 may be connected to the output terminal Vout, or may be grounded. A source electrode of the switching transistor 200 may be grounded.

When a voltage of 0 V is applied to the input terminal Vin, e.g., when the switching transistor 200 is turned off, and a high level power voltage is applied to the drain electrode of the load transistor 100 via the power source VDD, a high level voltage may be detected at the output terminal Vout. While the power voltage is being further applied to the drain electrode of the load transistor 100, a voltage greater than a threshold voltage may be applied to the input terminal Vin to turn on the switching transistor 200, and most of the current may flow through the switching transistor 200 to the ground. Accordingly, a low level voltage may be detected from the output terminal Vout. According to example embodiments, as the power voltage is fixed, the voltage output at the output terminal Vout may vary according to a voltage applied to the input terminal Vin.

Figure 6A:
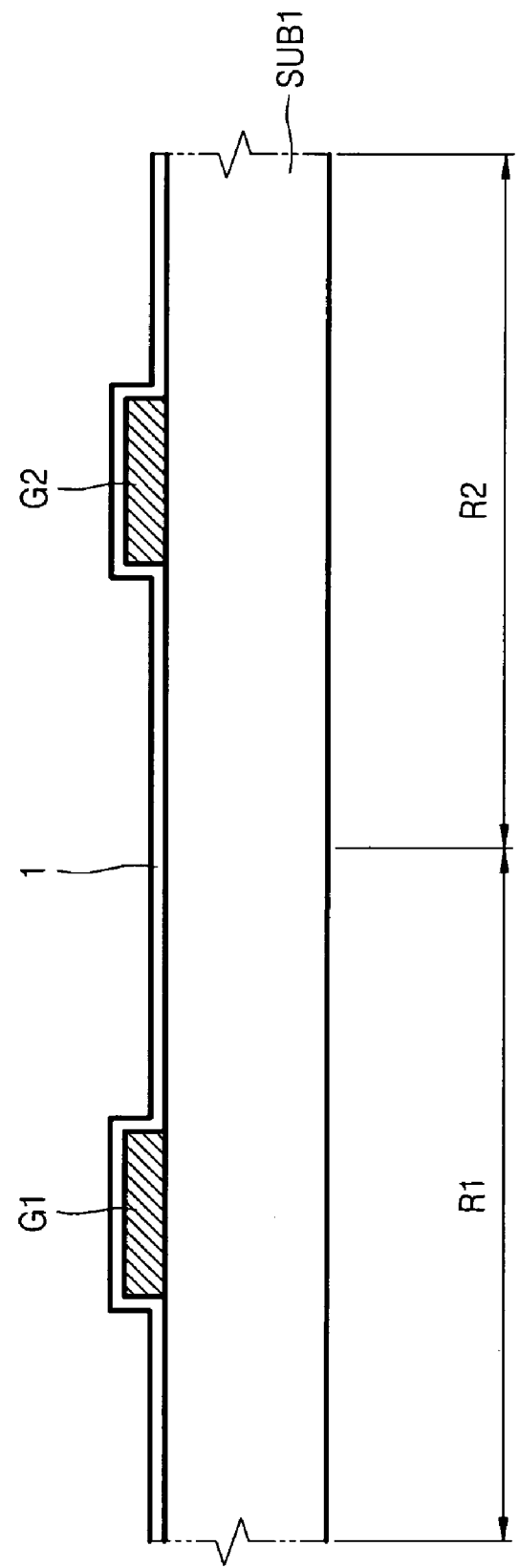

FIGS. 6A through 6F are cross-sectional views illustrating a method of manufacturing an inverter, according to example embodiments. Referring to FIG. 6A, a first gate electrode G1 and a second gate electrode G2 may be formed in a first region R1 and a second region R2 of a substrate SUB1. The first and second gate electrodes G1 and G2 may be formed of a metal, e.g., Mo, and/or other metals. Before forming the first and second gate electrodes G1 and G2, an insulating underlayer (not shown) may be deposited on a top surface of the substrate SUB1, and the first and second gate electrodes G1 and G2 may be formed on the insulating underlayer. A first gate insulating material layer 1 may be formed on the first and second regions R1 and R2 of the substrate SUB1 to also cover the first and second gate electrodes G1 and G2. The first gate insulating material layer 1 may be formed of, e.g., silicon oxide.

Figure 6B:
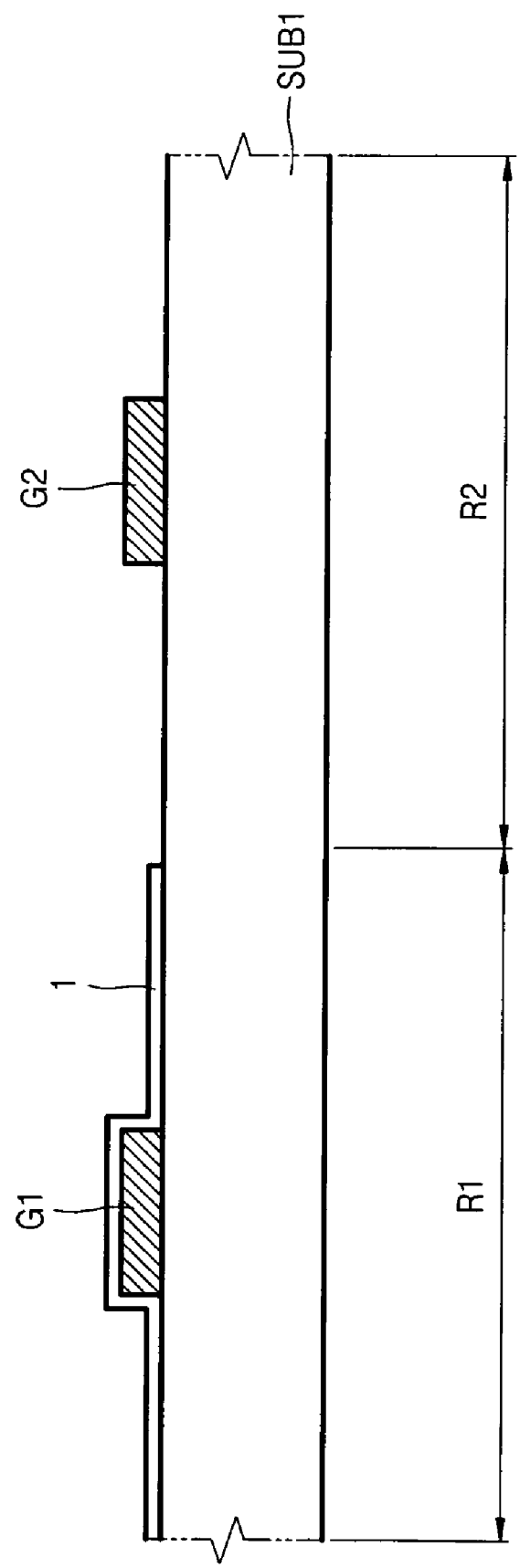

The first gate insulating material layer 1 of the second region R2 may be selectively removed by an etching process, and the result thereof is shown in FIG. 6B. FIG. 6C shows a second gate insulating material layer 1' formed on the top surface of the substrate SUB1. According to example embodiments, the second gate insulating material layer 1' may be formed of silicon oxide and may have a thickness of about 100 Å or less. The silicon oxide layer 1' formed in the second region R2 may be thinner than the first and second silicon oxide layers 1 and 1' formed in the first region R1. The thickness of the first and second silicon oxide layers 1 and 1' formed in the first region R1 may be greater than about 100 Å, but may also be smaller than about 100 Å, according to circumstances.

Figure 6D:
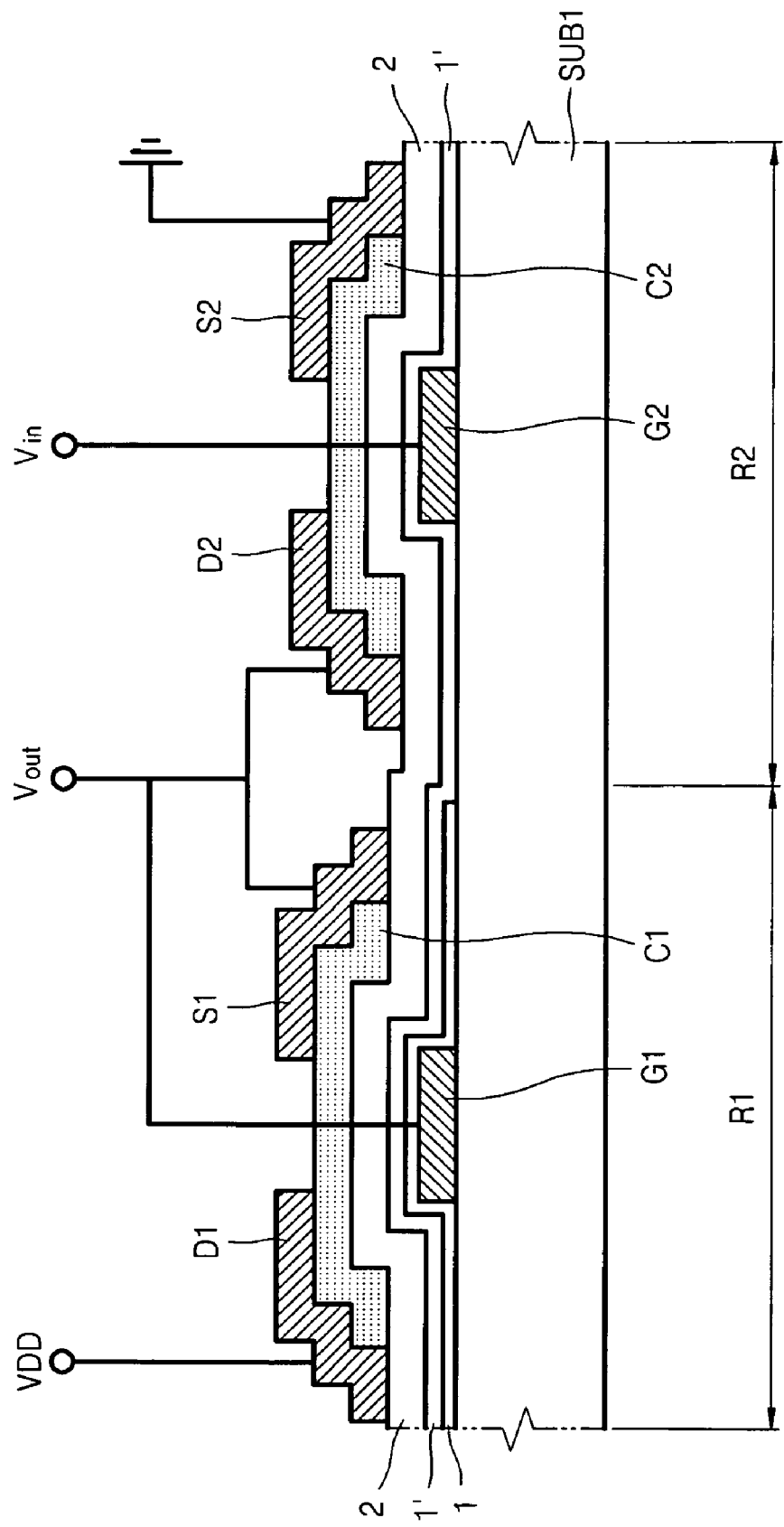

Referring to FIG. 6D, a third gate insulating material layer 2 may be formed on the second gate insulating material layer 1' of the first and second regions R1 and R2. According to example embodiments, the third gate insulating material layer 2 may be formed of silicon nitride. The thickness of the third gate insulating material layer 2 may be about 200 Å. However, the thickness thereof may also vary.

A first channel layer C1 may be formed on the third gate insulating material layer 2 over the first gate electrode G1, and a second channel layer C2 may be formed on the third gate insulating material layer 2 over the second gate electrode G2. The first and second channel layers C1 and C2 may be formed using a sputtering method, and materials as described with reference to FIG. 1. A first source electrode S1 and a first drain electrode D1 contacting both ends of the first channel layer C1, and a second source electrode S2 and a second drain electrode D2 contacting both ends of the second channel layer C2 may be formed on the third gate insulating material layer 2.

The first and second source electrodes S1 and S2 and the first and second drain electrodes D1 and D2 may be formed of a metal, e.g., Mo, or other materials. The first drain electrode D1 may be connected to a power source VDD, and the second gate electrode G2 may be connected to an input terminal Vin. The first source electrode S1, the second drain electrode D2, and the first gate electrode G1 may be commonly connected to an output terminal Vout, and the second source electrode S2 may be grounded. According to example embodiments, the first gate electrode G1 may be grounded instead of being connected to the output terminal Vout.

The resultant structure of FIG. 6D may be annealed at about 250° C. for a period of time, e.g., about an hour. Although not illustrated in the drawing, before the annealing process, a passivation layer covering the first and second channel layers C1 and C2, the first and second source electrodes S1 and S2, and the first and second drain electrodes D1 and D2 may be formed on the third gate insulating material layer 2. The passivation layer may be formed of an insulating material, e.g., silicon oxide, and using a process, e.g., a plasma enhanced chemical vapor deposition (PECVD) process.

Figure 6E:
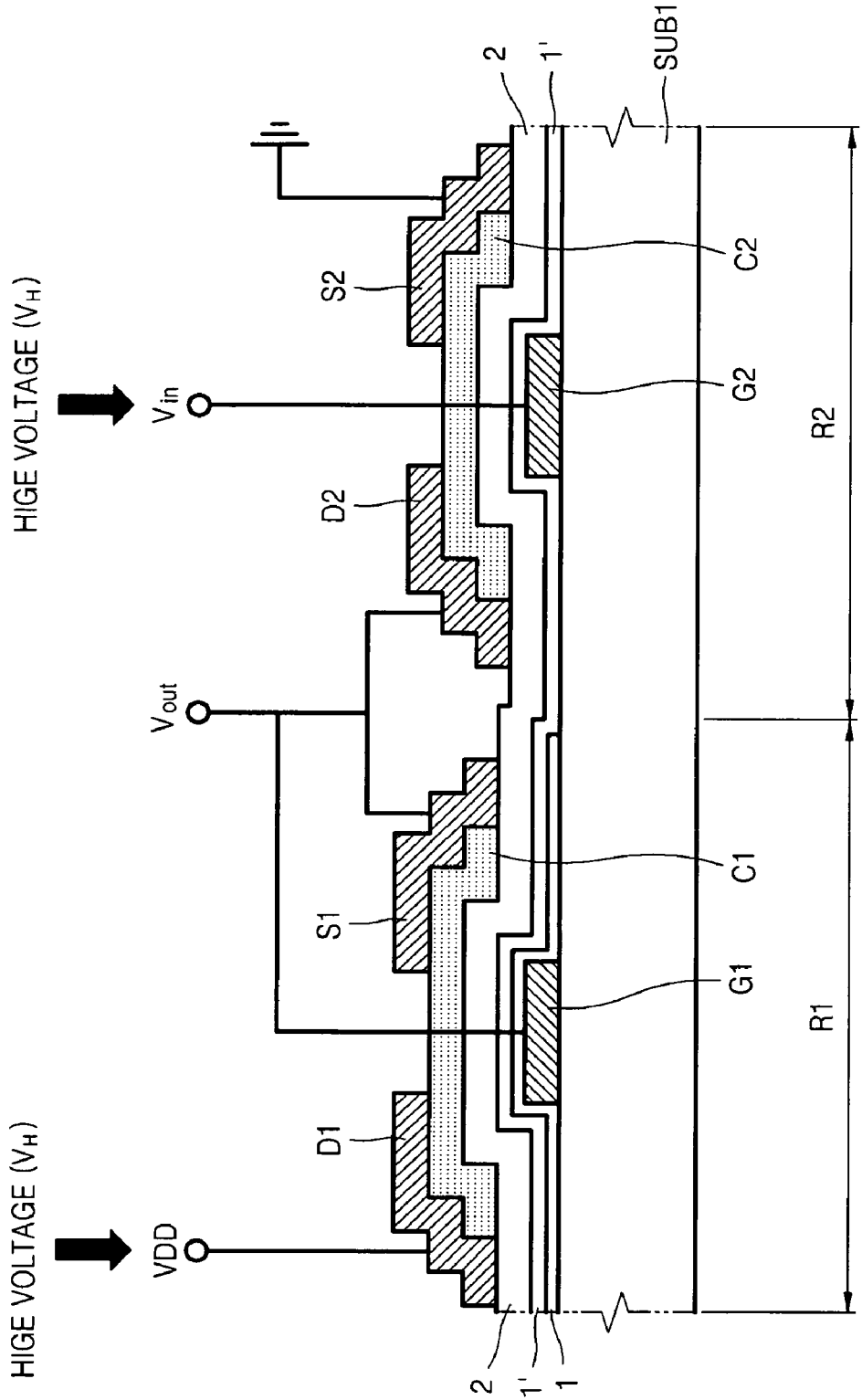

Referring to FIG. 6E, a high voltage VH may be applied to the second gate electrode G2 via the input terminal Vin. The high voltage VH may be about 10 V or greater, and applied for a time period of about 0.5 ms or longer. While applying the high voltage VH to the second gate electrode G2, another high voltage VH may also be optionally applied to the first drain electrode D1. Thus, by applying the high voltage VH to the second gate electrode G2 or to both the second gate electrode G2 and the first drain electrode D1, the third gate insulating material layer 2 between the channel layer C2 and the second gate electrode G2 may trap charges.

Because the electric barrier of the third gate insulating material layer 2 with respect to the second channel layer C2 need not be so high and the third gate insulating material layer 2 may be a material layer having a lot of trap sites, a larger amount of charges (electrons) may be moved from the second channel layer C2 to the third gate insulating material layer 2, due to the high voltage VH, and be trapped. Also, because charges (electrons) tunnel through the relatively thin second gate insulating material layer 1', a larger amount of charges (electrons) may be moved from the second gate electrode G2 to the third gate insulating material layer 2, and be trapped. The charge trapping mechanism need not be limited to the above-described one.

Figure 6F:
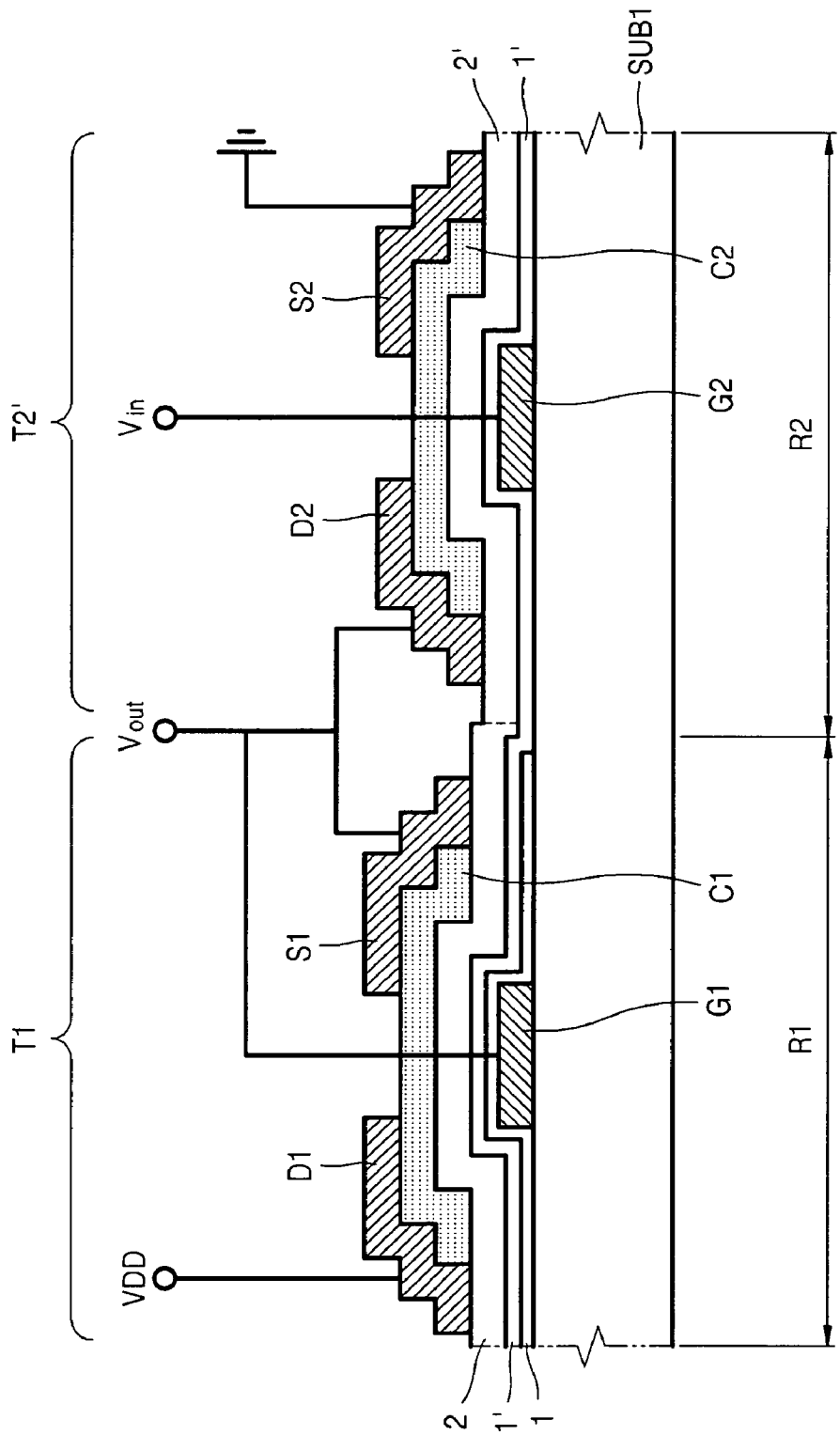

FIG. 6F illustrates the inverter in which the charge trapping is completed. In FIG. 6F, reference numeral 2' denotes the charge-trapped third gate insulating material layer. The charge-trapped third gate insulating material layer 2' may correspond to the silicon nitride layer 2a' in FIG. 2. The first gate insulating material layer 1 and the second gate insulating material layer 1' of the first region R1 may correspond to the silicon oxide layer 1a of FIG. 2, and the third gate insulating material layer 2 may correspond to the silicon nitride layer 2a of FIG. 2. The second gate insulating material layer 1' of the second region R2 may correspond to the silicon oxide layer 1a' of the switching transistor T2' of FIG. 2. Accordingly, the transistor T1 (load transistor) of the first region R1 and the transistor T2' (switching transistor) of the second region R2 may correspond to the load transistor T1 and the switching transistor T2' of FIG. 2.

Figure 7:
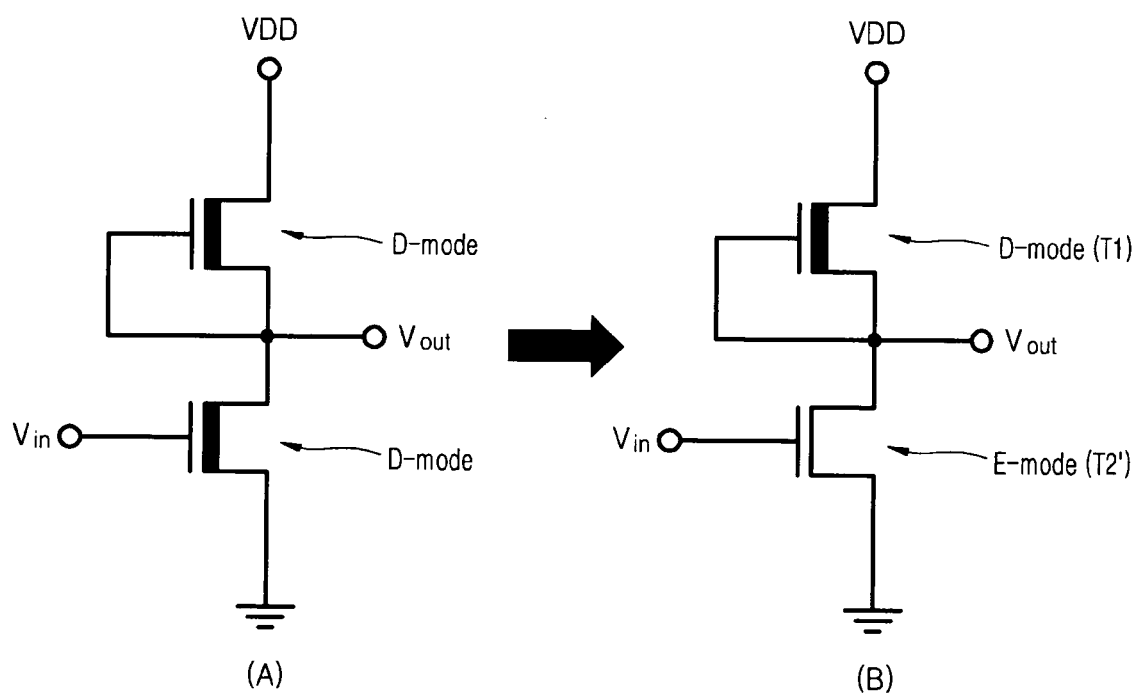

As described above, as the third gate insulating material layer 2' of the second region R2 traps charges, a threshold voltage of a transistor including the third gate insulating material layer 2' of the second region R2, for example, the switching transistor T2', may be changed from a negative (−) value to a positive (+) value. In other words, the switching transistor T2' may be changed from a depletion mode transistor to an enhancement mode transistor. FIG. 7 is a circuit diagram illustrating the change of the characteristics of the inverter due to the applied high voltage VH. FIGS. 7 (A) and (B) illustrate the states of the inverter before and after applying a high voltage VH. The circuit diagram of FIG. 7(B) may correspond to that of FIG. 5.

Because a high voltage need not be applied to the first gate electrode G1 of the load transistor T1 of the first region R1 in the operation described with reference to FIG. 6E, the third gate insulating material layer 2 of the first region R1 may minimally trap or trap zero charges. Accordingly, only the gate insulating layer of the switching transistor T2' of the second region R2 may trap charges even though the load transistor T1 of the first region R1 and the switching transistor T2' of the second region R2 have the same structures.

Nevertheless, the gate insulating layer of the load transistor T1 may be formed to have a structure and of a material that may have difficulty in trapping charges unlike the gate insulating layers of the switching transistor T2'. Thus, the probability that charges are trapped in the gate insulating layer of the load transistor T1 may be further reduced. According to example embodiments, even when a high voltage is applied to the first gate electrode G1, charge tunneling through the first gate insulating material layer 1 and the second gate insulating material layer 1' may be difficult, and thus, trapping the charges in the third gate insulating material layer 2 may be difficult.

A voltage used in a normal operation mode may be smaller than the high voltage VH used during the above charge trapping, and the applying time may also be shorter than that of the high voltage VH. Thus, a threshold voltage of the switching transistor T2' or the load transistor T1 may not change during a normal operation mode.

Applying the high voltage VH as described with reference to FIG. 6E, for example, adjusting the threshold voltage of the switching transistor T2', may be regarded as a part of the manufacturing method, but also, may be regarded as a part of an operating method. According to example embodiments, applying the high voltage VH may be performed as a preliminary operation before a normal operation.

The method of manufacturing an inverter, as described with reference to FIGS. 6A through 6F, may be modified in various manners. According to example embodiments, the inverter having the structure of FIG. 1 may be obtained by increasing the thickness of the first gate insulating material layer 1 in the operation described with reference to FIG. 6A and omitting the operation of forming the second gate insulating material layer 1', as described with reference to FIG. 6C. Also, by integrating some of the operations of FIGS. 6A through 6F and a method of manufacturing a general top gate transistor, the inverters having the structures of FIGS. 3 and 4 may also be obtained.

Figure 8:
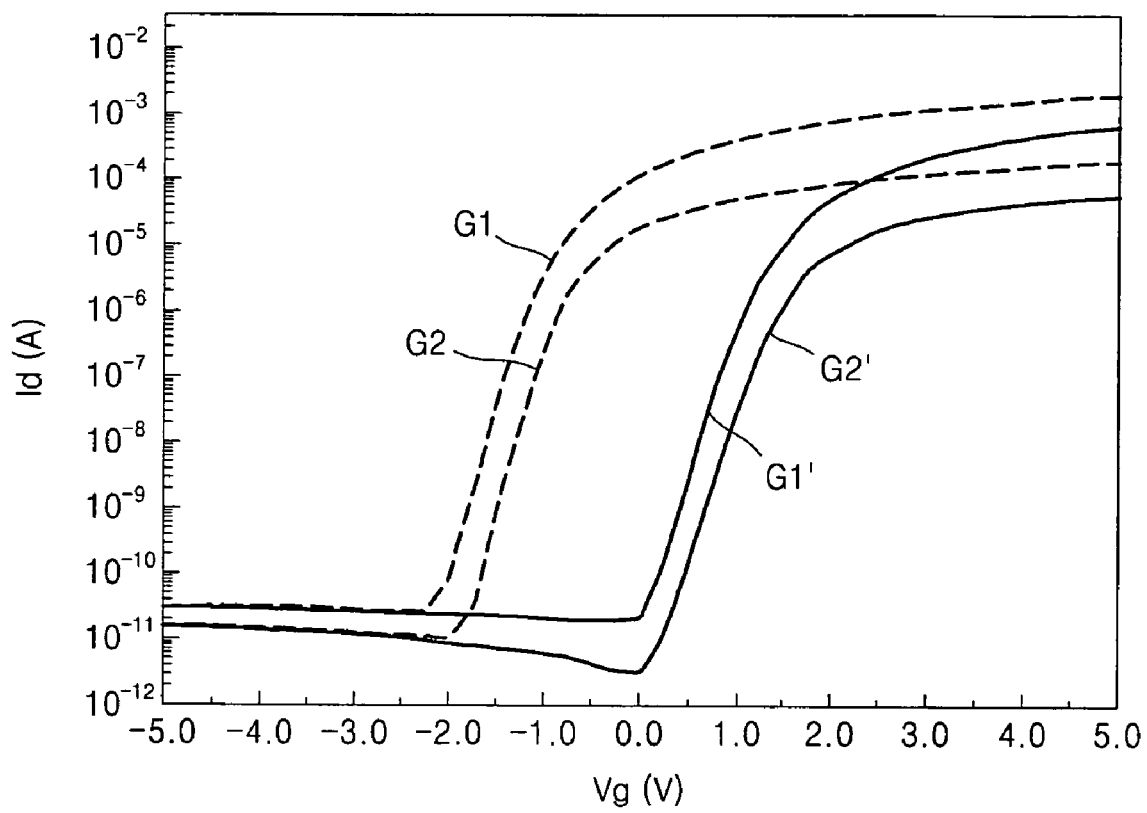

FIG. 8 is a graph showing variation of the characteristics of the switching transistor T2', which is the transistor of the second region R2, according to example embodiments, the graph shows variation in gate voltage Vg—drain current Id, according to a high voltage applied in the operation described with reference to FIG. 6E, according to example embodiments. The second channel layer C2, the second gate insulating material layer 1', and the third gate insulating material layer 2 of the switching transistor T2' (the transistor of the second region R2 in FIG. 6E) used to obtain the above result were a GaInZnO layer (thickness: about 600 Å), a silicon oxide layer (thickness: about 60 Å), and a silicon nitride layer (thickness: about 200 Å). Also, a high voltage VH of about 16 V was used, and applied for about 1 Ms.

In FIG. 8, G1 and G2 show the gate voltage-drain current characteristics of the inverter before applying the high voltage VH, and G1' and G2' show the gate voltage-drain current characteristics of the inverter after applying the high voltage VH. G1 and G1' show the result measured using a drain voltage of about 1.1 V, and G2 and G2' show the result measured using a drain voltage of about 0.1 V.

FIG. 8 shows the results before and after applying the high voltage VH. G1 and G2 show the before whereas G1' and G2' show the after. G1' and G2' are positioned farther to the right side of G1 and G2, which indicates that a threshold voltage of the switching transistor T2' may be moved in a positive (+) direction by the applied high voltage $V_H$.

Figure 9:
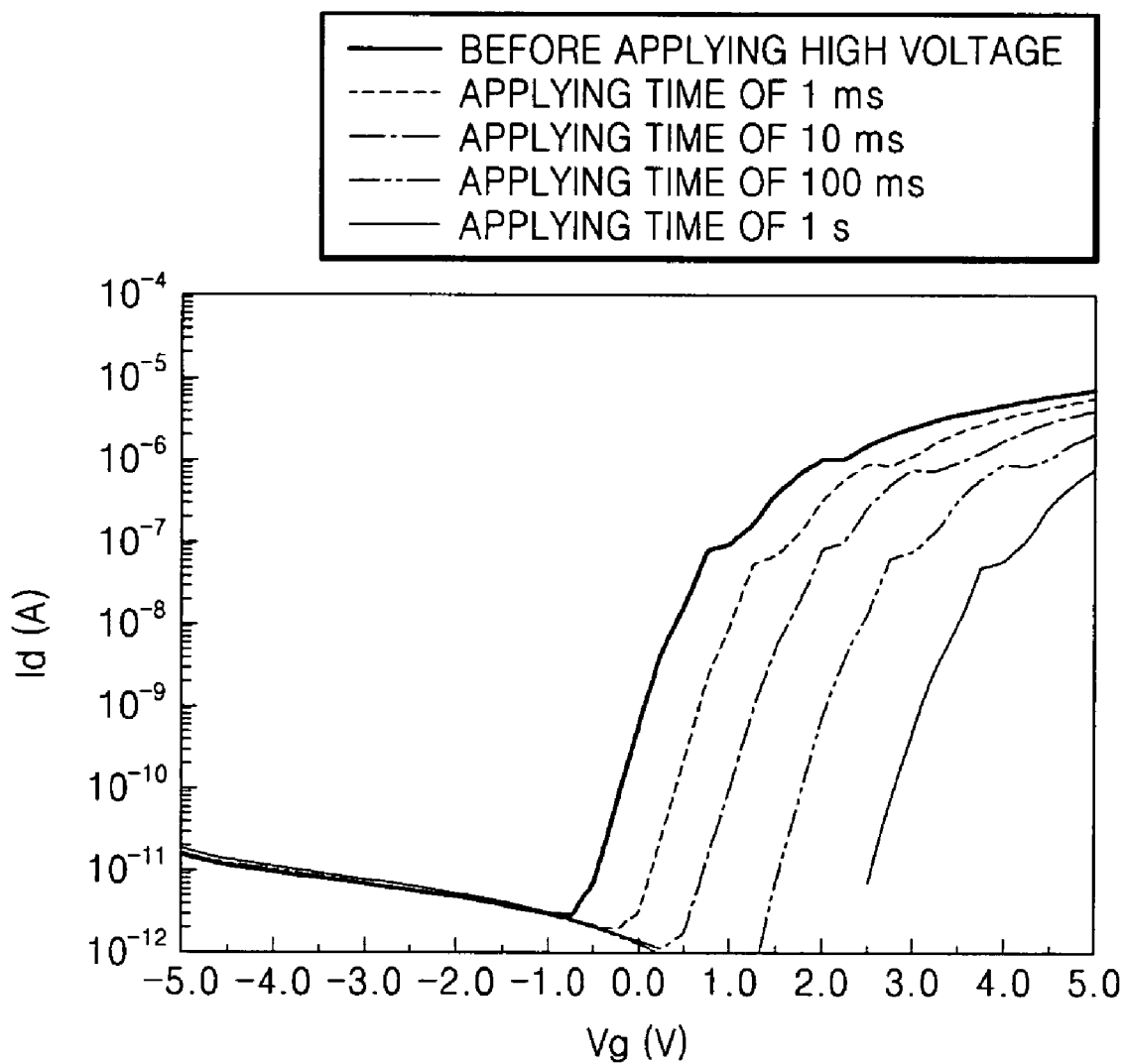

FIG. 9 shows the variation in the gate voltage (Vg)—drain current (Id) characteristics of a switching transistor according to the time a high voltage $V_H$ is applied, according to example embodiments. The structure of the switching transistor used to obtain the above result corresponds to the structure of the switching transistor of FIG. 1, wherein a channel layer and a gate insulating layer of the switching transistor were a GaInZnO layer (thickness: about 600 Å) and a silicon nitride layer (thickness: about 600 Å). A high voltage $V_H$ applied to a gate electrode was about 20 V, and a drain voltage was about 1.1 V. Referring to FIG. 9, as the time the high voltage $V_H$ is being applied to the gate electrode increases, the curves may move to the right side by a considerable voltage.

Figure 10:
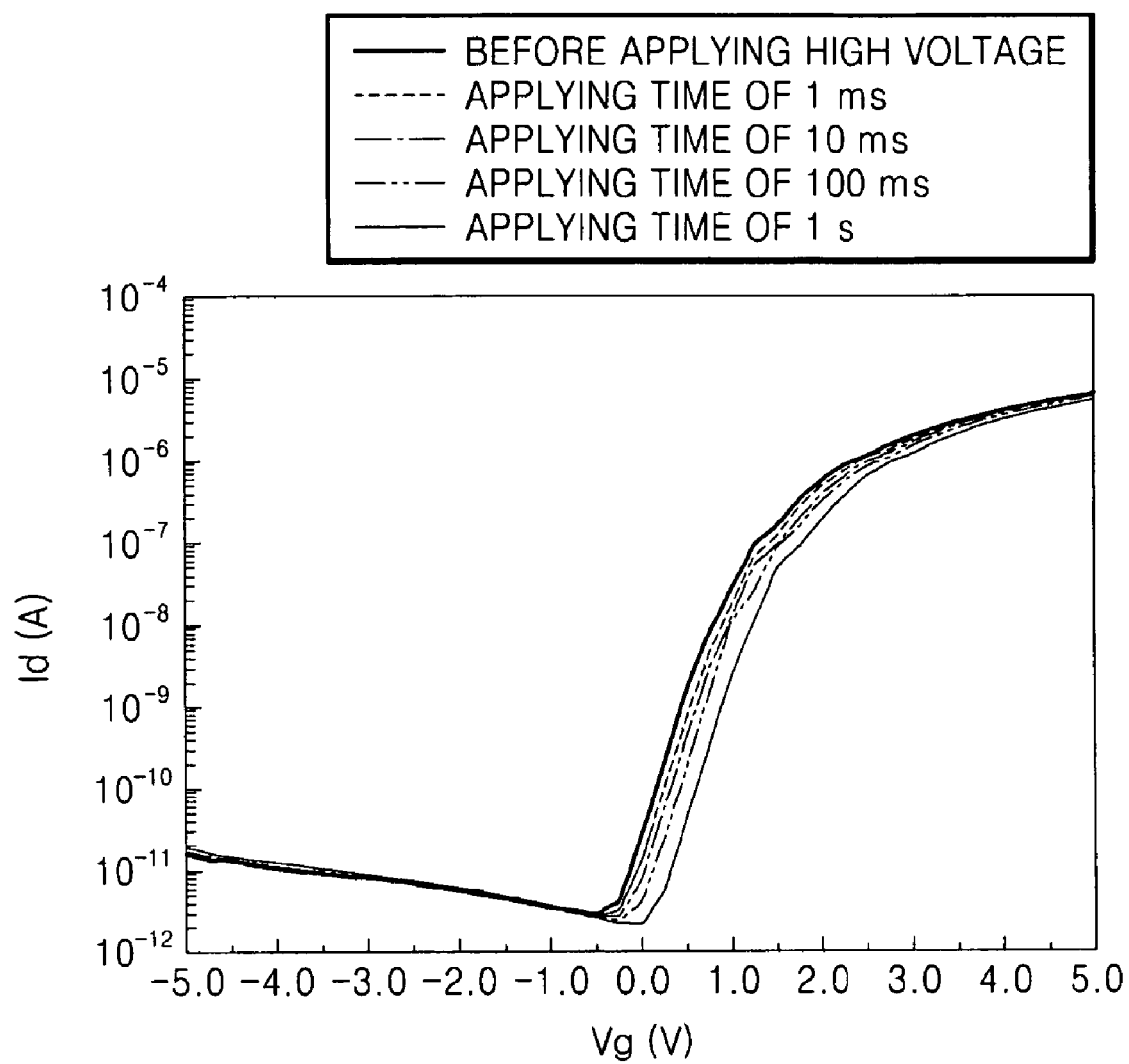

FIG. 10 is a graph showing variation in the gate voltage Vg-drain current Id characteristics of a transistor, according to a comparative example, when a high voltage is applied to a gate electrode of the transistor. A gate insulating layer of the transistor according to the comparative example was a single layer formed of silicon oxide (thickness: about 600 Å), and a GaInZnO channel layer (thickness: about 600 Å). A high voltage applied to the gate electrode was about 20 V, and a drain voltage was about 1.1 V.

Referring to FIG. 10, even when the high voltage is applied to the gate electrode, the curve is not moved to a great extent, as the high voltage is applied over time. In the transistor according to the comparative example, the silicon oxide layer (gate insulating layer) contacting the channel layer may be thick and may have a high electric barrier to the channel layer. Even when the high voltage is applied to the gate electrode, trapping charges in the silicon oxide layer (gate insulating layer) may be difficult.

Figure 11:
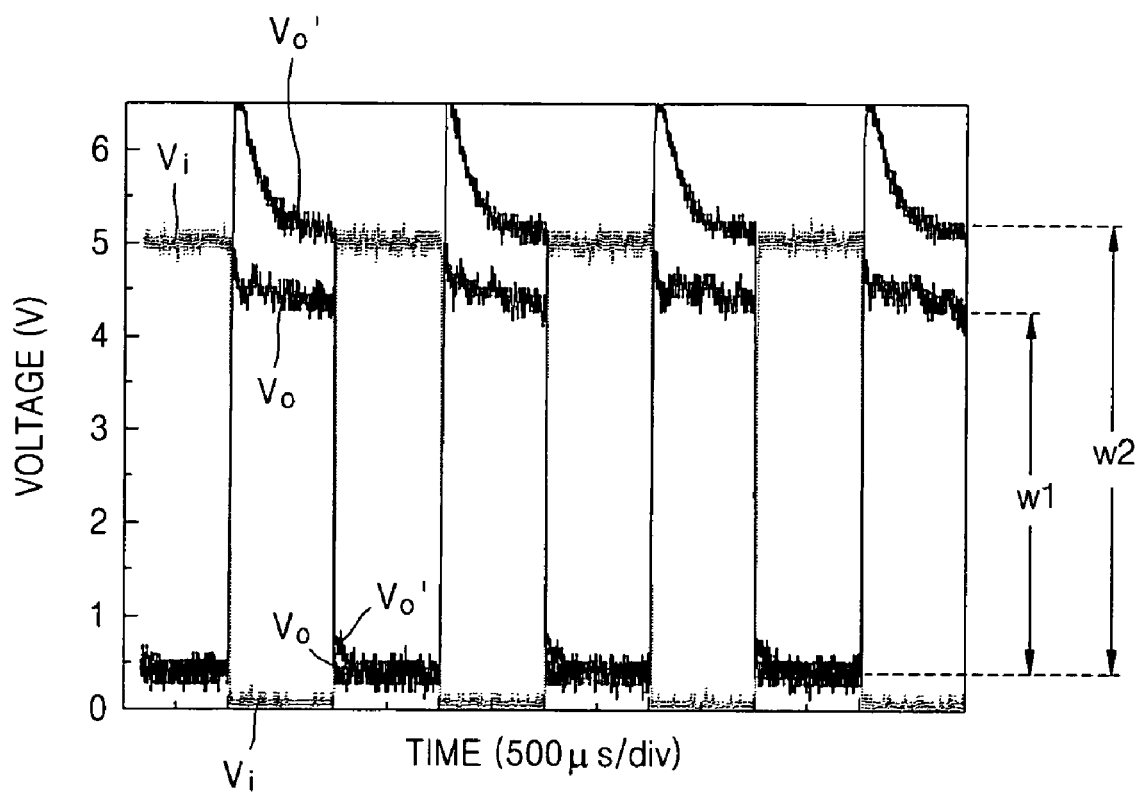

FIG. 11 shows a waveform diagram of an input voltage and an output voltage of the inverter according to example embodiments. Vi is a waveform of an input voltage, and Vo is a waveform of an output voltage of the inverter before applying a high voltage, and Vo' is a waveform of an output voltage of the inverter, according to example embodiments, an E/D inverter, after applying a high voltage.

Referring to FIG. 11, the waveform Vo may have a swing width W1 of about 4 V, and the waveform Vo' may have a swing width W2 of about 5 V. The inverter shows improved swing characteristics after applying a high voltage than before applying a high voltage. The variation width of the input voltage may be about 5 V, as indicated by the waveform Vi.

As described above, according to example embodiments, an enhancement-mode transistor having a positive (+) threshold voltage may be realized by trapping charges in the gate insulating layers, and an E/D inverter may be manufactured using the enhancement-mode transistor.

According to example embodiments, the above-described inverters may be used as a basic element of various logic circuits e.g. a NAND circuit, a NOR circuit, an encoder, a decoder, a multiplexer (MUX), a demultiplexer (DEMUX), and a sense amplifier. The basic structure of the logic circuits is well known in the art, and thus description thereof will be omitted.

According to example embodiments, the inverter and logic circuits including the inverter, may be applied in various fields, e.g., liquid crystal displays, organic light emitting devices, or memory devices. According to example embodiments, when the load transistor and the switching transistor of the inverter are oxide TFTs, the oxide TFTs may be formed using a low temperature process, and may have improved mobility. According to example embodiments, an E/D inverter formed of an oxide TFT according to example embodiments may be easily applied as a peripheral device for three-dimensional stack memories, e.g., a 1D(diode)-1R(resistor) multi-layer cross-point memory device, which may be manufactured using a relatively low temperature process.

While example embodiments may have been particularly shown and described with reference to example embodiments thereof, example embodiments should be considered in descriptive sense only and not for purposes of limitation. According to example embodiments, it will be understood by those of ordinary skill in the art that the transistor with an increased threshold voltage manufactured by trapping charges in the gate insulating layer may be applied to other devices other than an inverter.

According to example embodiments, the switching transistors T2, T2', T22, and T22' with an increased threshold voltage manufactured by trapping charges in the gate insulating layers of the inverter of FIGS. 1 through 4 may be regarded as an element of example embodiments. Also, it will be understood by those of ordinary skill in the art that the structure and elements of the inverter of FIGS. 1 through 4 and modified examples of the inverter may be modified variously, and that the method of manufacturing the inverter of FIGS. 6A through 6F may also be modified in various manners. Also, it will be understood by those of ordinary skill in the art that the inverter and the logic circuits according to example embodiments may be applied not only to liquid crystal displays or organic light emitting devices but also memory devices and other devices. Therefore, the scope of example embodiments is not defined by the detailed description of example embodiments but by the appended claims.

It should be understood that example embodiments described herein should be considered in a descriptive sense only and not for purposes of limitation. Descriptions of features or aspects within each embodiment should typically be considered as available for other similar features or aspects in other example embodiments.

While example embodiments have been particularly shown and described, it will be understood by one of ordinary skill in the art that variations in form and detail may be made therein without departing from the spirit and scope of the claims.

What is claimed is:

1. An inverter comprising:
   a load transistor including a first oxide channel layer, a first gate and a first gate insulating layer between the first oxide channel layer and the first gate, the first gate insulating layer includes a first layer and a second layer sequentially disposed on the first gate; and
   a switching transistor connected to the load transistor, the switching transistor including a second oxide channel layer, a second gate and a second gate insulating layer between the second oxide channel layer and the second gate, the second gate insulating layer includes a third layer having a same material as the second layer, the second gate insulating layer being a different structure than the first gate insulating layer, the second gate insulating layer includes a charge trap region such that charges are trapped in the charge trap region of the second gate insulating layer rather than in the first gate insluting layer and a threshold voltage of the switching transistor is increased by the trapped charges such that the switching transistor is an enhancement-mode transistor.

2. The inverter of claim 1, wherein the load transistor is a depletion-mode transistor.

3. The inverter of claim 1, wherein the load transistor and the switching transistor are oxide thin-film transistors (TFTs).

4. The inverter of claim 1, wherein the second gate insulating layer includes a third layer, the third layer being a silicon nitride layer.

5. The inverter of claim 1, wherein the first layer of the gate insulating layer is a silicon oxide layer.

6. The inverter of claim 1, wherein the first gate insulating layer includes,
   a silicon oxide layer as the first layer, and a silicon nitride layer as the second layer.

7. The inverter of claim 6, wherein the second gate insulating layer includes,
   a silicon oxide layer between the third layer and the second gate, and
   a silicon nitride layer as the third layer, and
   the silicon oxide layer of the second gate insulating layer having a thickness less than the thickness of the silicon oxide layer of the first gate insulating layer.

8. The inverter of claim 1, wherein the first gate insulating layer includes,
   a first silicon oxide layer as the first layer,
   a silicon nitride layer as the second layer, and
   a second silicon oxide layer on the silicon nitride layer, the second gate insulating layer includes,
   a first silicon oxide layer between the third layer and the second gate,
   a silicon nitride layer as the third layer on the first silicon oxide layer, and
   a second silicon oxide layer on the silicon nitride layer, and
   the first silicon oxide layer of the second gate insulating layer has a thickness less than the thickness of the first silicon oxide layer of the first gate insulating layer.

9. The inverter of claim 1, wherein the first gate insulating layer and the second gate insulating layer have one of a high-k dielectric layer/silicon nitride layer structure, a first high-k dielectric layer/second high-k dielectric layer/third high-k dielectric layer structure, an inverse high-k dielectric layer/silicon nitride layer structure, and an inverse first high-k dielectric layer/second high-k dielectric layer/third high-k dielectric layer structure, and
   at least one layer of the second gate insulating layer has a different thickness from the thickness of at least one of the layers of the first gate insulating layer.

10. The inverter of claim 1, wherein the second gate insulating layer has a structure in which a plurality of nanostructures are embedded in an insulating layer.

11. The inverter of claim 1, wherein at least one of the load transistor and the switching transistor is a bottom gate thin film transistor or a top gate thin film transistor.

* * * * *